United States Patent
Yamaguchi et al.

(10) Patent No.: US 9,137,926 B2
(45) Date of Patent: Sep. 15, 2015

(54) ELECTRONIC DEVICE AND METHOD OF MANUFACTURING THE SAME

(71) Applicant: FUJITSU LIMITED, Kawasaki, Kanagawa (JP)

(72) Inventors: Yoshitaka Yamaguchi, Kawasaki (JP); Taisuke Iwai, Ebina (JP); Seiki Sakuyama, Isehara (JP); Yoshihiro Mizuno, Kobe (JP); Masaaki Norimatsu, Atsugi (JP); Yukie Sakita, Atsugi (JP); Koji Asano, Shinjyuku (JP); Shinichi Hirose, Yokohama (JP); Yohei Yagishita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 229 days.

(21) Appl. No.: 13/675,335

(22) Filed: Nov. 13, 2012

(65) Prior Publication Data

US 2013/0188319 A1    Jul. 25, 2013

(30) Foreign Application Priority Data

Jan. 25, 2012   (JP) .................. 2012-013583

(51) Int. Cl.
*H01L 23/34* (2006.01)
*H01L 21/56* (2006.01)
(Continued)

(52) U.S. Cl.
CPC .......... *H05K 7/2039* (2013.01); *H01L 21/4817* (2013.01); *H01L 21/56* (2013.01); *H01L 23/367* (2013.01); *H01L 23/373* (2013.01); *H01L 24/29* (2013.01); *H01L 23/42* (2013.01); *H01L 2224/16225* (2013.01); *H01L 2224/32245* (2013.01); *H01L 2224/73253* (2013.01); *H01L 2924/15311* (2013.01); *H01L 2924/16152* (2013.01); *H01L 2924/16251* (2013.01)

(58) Field of Classification Search
CPC .................. H05K 7/2039–7/20518; H01L 23/36–23/3738
USPC ............... 361/679.46–679.54, 688–723; 165/80.1–80.5, 104.33, 185; 257/712–713, 717, 720
See application file for complete search history.

(56) References Cited

U.S. PATENT DOCUMENTS 7,134,881 B1    11/2006   Sakairi
7,787,250 B2 *   8/2010   Li et al. .................. 361/715
(Continued)

FOREIGN PATENT DOCUMENTS

JP    2003-69187 A1    3/2003
JP    2004-165586 A1   6/2004
(Continued)

OTHER PUBLICATIONS

Notice of Preliminary Rejection mailed Mar. 28, 2014 from the Korean Intellectual Property Office issued in counterpart application No. 10-2012-132903 with English translation.
(Continued)

*Primary Examiner* — Zachary M Pape
(74) *Attorney, Agent, or Firm* — Kratz, Quintos & Hanson, LLP (57) ABSTRACT

An electronic device includes: a semiconductor device; a heat-conductive resin, disposed above the semiconductor device, including a heat conductor and a resin; a linear carbon piece, disposed above the heat-conductive resin, to be thermally in contact with the heat conductor; and a heat spreader, disposed above the linear carbon piece, including a depressed portion having the heat-conductive resin.

14 Claims, 11 Drawing Sheets

(51) Int. Cl.
*H01L 23/367* (2006.01)
*H01L 23/373* (2006.01)
*H01L 21/48* (2006.01)
*H01L 23/00* (2006.01)
*H05K 7/20* (2006.01)
*H01L 23/42* (2006.01)

(56) References Cited

U.S. PATENT DOCUMENTS

| | | | |
|---|---|---|---|
| 2004/0084764 A1 | 5/2004 | Ishimine | |
| 2005/0116336 A1 | 6/2005 | Chopra et al. | |
| 2010/0124025 A1* | 5/2010 | Yamaguchi et al. | 361/708 |
| 2010/0299918 A1* | 12/2010 | Oda | 29/841 |
| 2011/0083836 A1* | 4/2011 | Kobayashi | 165/185 |
| 2012/0218713 A1* | 8/2012 | Yamaguchi et al. | 361/708 |
| 2012/0236502 A1* | 9/2012 | Yamaguchi et al. | 361/704 |
| 2012/0325454 A1* | 12/2012 | Iwai et al. | 165/185 |

FOREIGN PATENT DOCUMENTS

| | | |
|---|---|---|
| JP | 2007-165149 A1 | 6/2007 |
| JP | 2011-086700 A | 4/2011 |
| JP | 2011-96832 A1 | 5/2011 |
| JP | 2011-204749 A | 10/2011 |

OTHER PUBLICATIONS

Office Action of Taiwanese Patent Application No. 101142383 dated Nov. 21, 2014. English Summary of Taiwanese Office Action based on cited reference.
Chinese Office Action No. 201210477612.0 dated Feb. 27, 2015 with English translation.

* cited by examiner

ELECTRONIC DEVICE AND METHOD OF MANUFACTURING THE SAME

CROSS-REFERENCE TO RELATED APPLICATION

This application is based upon and claims the benefit of priority of the prior Japanese Patent Application No. 2012-13583, filed on Jan. 25, 2012, the entire contents of which are incorporated herein by reference.

FIELD

The embodiments discussed herein are related to an electronic device and a method of manufacturing the electronic device.

BACKGROUND

With the increasing performance and decreasing size of electronic apparatuses, semiconductor chips are surface-mounted on a circuit board in the form of bare chips to provide electronic components incorporated in electronic apparatuses with high density. For example, semiconductor chips are flip-chip mounted on a circuit board.

The related art is disclosed in Japanese Patent No. 4036742 and Japanese Laid-open Patent Publication Nos. 2003-69187, 2004-165586, 2007-165149, and 2011-96832.

SUMMARY

According to one aspect of the embodiments, an electronic device includes: a semiconductor device; a heat-conductive resin, disposed above the semiconductor device, including a heat conductor and a resin; a linear carbon piece, disposed above the heat-conductive resin, to be thermally in contact with the heat conductor; and a heat spreader, disposed above the linear carbon piece, including a depressed portion having the heat-conductive resin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A flip-chip mounted semiconductor chip with high performance generates a large amount of heat. Therefore, for example, a heat sink composed of a material having high heat conductivity, such as copper, is disposed via a thermal interface material (TIM) which is disposed above the semiconductor chip. The distance between the semiconductor chip and the heat sink is short, and thus a semiconductor chip with heat is efficiently cooled.

A heat-conductive resin including a resin and a heat conductor (filler) such as carbon nanotube (hereinafter referred to as "CNT") may be used as the TIM. A sheet member formed by dispersing a plurality of second CNTs at the bottom of a resin layer which fills with a plurality of first CNTs may be used as the heat-conductive resin that uses CNT.

In the case where the heat-conductive resin is used as the TIM, a resin component of the heat-conductive resin melts and flows to the surrounding region due to the temperature and pressure applied when a heat spreader is mounted on the heat-conductive resin. Therefore, the heat conductor of the heat-conductive resin and the heat spreader are thermally brought into contact with each other.

However, when the heat spreader is mounted, the heat-conductive resin may remain between the heat conductor and the heat spreader without being removed, due to an uneven surface of the heat spreader or undulations of the heat spreader. The heat conductivity of the resin component of the heat-conductive resin is as small as about several watts per meter Kelvin (W/m·K). Therefore, if the resin remains in a contact interface between the heat conductor and the heat spreader, the resin layer serves as a thermal resistance and the heat dissipation characteristics may be degraded.

In the case where the sheet member formed by dispersing a plurality of second CNTs at the bottom of a resin layer which fills a plurality of first CNTs is used as the TIM, when a heat spreader is mounted on a semiconductor device, the first CNTs in the heat-conductive resin are brought into contact with the second CNTs and a heat conduction path from the semiconductor device to the heat spreader is formed. If the mounting conditions of the heat spreader, such as heating temperature and pressure, are inappropriate, the second CNTs may flow out with the outflow of the resin component. As a result, the density of second CNTs above the semiconductor device becomes smaller than the density of second CNTs in the periphery, thereby degrading the heat dissipation characteristics.

Figure 1:
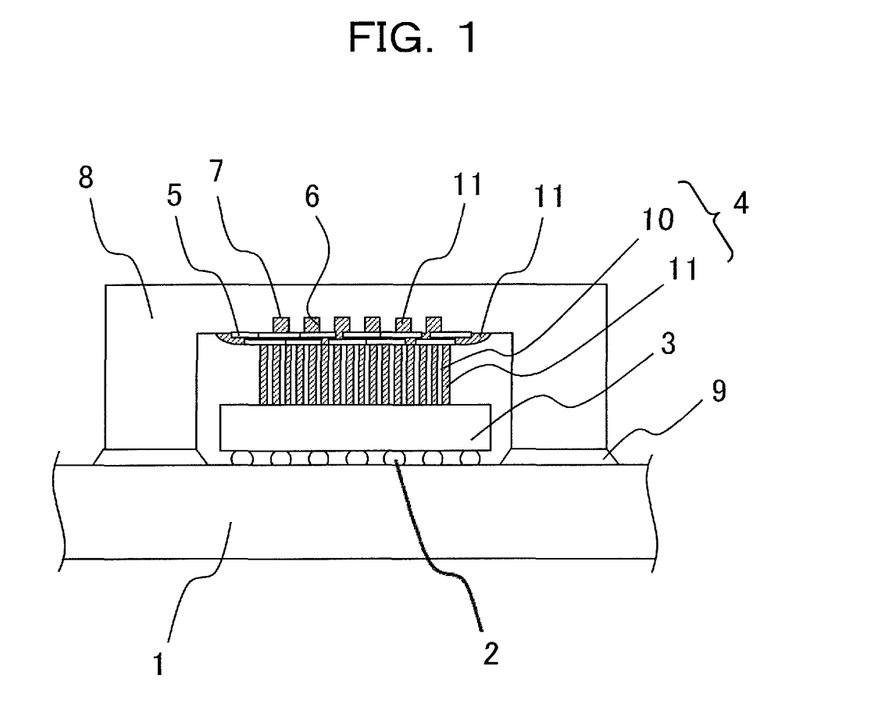
FIG. 1 illustrates an exemplary electronic device.

FIG. 1 illustrates an exemplary electronic device. The electronic device illustrated in FIG. 1 includes a semiconductor device 3 that is disposed above a circuit board 1 and is electrically coupled to the circuit board 1 through a plurality of solder bumps 2, a heat-conductive resin 4 that is disposed on the semiconductor device 3 and includes CNTs 10 and a resin 11, linear carbon pieces 5 that are disposed on the heat-conductive resin 4 and are thermally in contact with the CNTs 10, and a heat spreader 8 that is disposed on the linear carbon pieces 5 and includes depressed portions 7 filled with the resin 11. The heat spreader 8 may be fixed onto the circuit board 1 using an adhesive 9.

In the circuit board 1, wiring patterns containing Cu are formed on both surfaces of a substrate composed of, for example, glass ceramic, glass epoxy, or bismaleimide triazine (BT) resin. The wiring patterns are electrically coupled to each other through via holes. As part of the wiring patterns, electrode pads are disposed at positions corresponding to the plurality of solder bumps 2. The wiring patterns, via-holes, and electrode pads may not be illustrated in FIG. 1.

The semiconductor device 3 may be, for example, a semiconductor chip obtained by forming an integrated circuit (IC) on a silicon substrate. Semiconductor chips generate heat through energization during the operation of integrated circuits. A semiconductor package in which a semiconductor chip is sealed (packed) with, for example, sealing resin, ceramic, or glass may be used as the semiconductor device 3.

The heat-conductive resin 4 may be used as a TIM that conducts heat generated in the semiconductor device 3 to the heat spreader 8. An example of the heat-conductive resin 4 that may be used is a CNT sheet. The CNT sheet may be a resin sheet that includes, as heat conductors, a plurality of CNTs 10 disposed apart from each other. The plurality of CNTs 10 are oriented in a sheet-thickness direction, for example, in a direction intersecting a sheet surface. The plurality of CNTs 10 are formed in a state in which the CNTs 10 are closely bunched. The end portions of the CNTs 10 in the sheet-thickness direction may be intertwined with one another.

The gaps between the CNTs 10 are filled with the resin 11, and the CNTs 10 are supported by the resin 11. The resin 11 may contain a material that melts by heating. The resin 11 may be, for example, a thermoplastic resin or a thermosetting resin such as an epoxy resin.

As the thermoplastic resin, for example, a hot-melt resin may be used. Examples of a polyamide hot-melt resin may include "Micromelt 6239" (softening point: 140° C.) manufactured by Henkel Japan Ltd. Examples of a polyester hot-melt resin may include "DH 598B" (softening point: 133° C.) manufactured by NOGAWA CHEMICAL Co., Ltd. Examples of a polyurethane hot-melt resin may include "DH 722B" manufactured by NOGAWA CHEMICAL Co., Ltd. Examples of a polyolefin hot-melt resin may include "EP-90" (softening point: 148° C.) manufactured by MATSUMURA OIL Co., Ltd. Examples of a hot-melt resin containing an ethylene copolymer may include "DA 574B" (softening point: 105° C.) manufactured by NOGAWA CHEMICAL Co., Ltd. Examples of a styrene-butadiene rubber hot-melt resin may include "M-6250" (softening point: 125° C.) manufactured by The Yokohama Rubber Company, Limited. Examples of an ethylene-vinyl acetate copolymer hot-melt resin may include "3747" (softening point: 104° C.) manufactured by Sumitomo 3M Limited. Examples of a butyl rubber hot-melt resin may include "M-6158" manufactured by The Yokohama Rubber Company, Limited.

A heat dissipation sheet containing a filler with high heat conductivity as a heat conductor may be used as the heat-conductive resin 4. Examples of the filler dispersed in the resin 11 include an elemental metal such as Au, Ag, Cu, Pt, Pd, Pb, Sn, Fe, Zn, Al, Cr, or Ti; an alloy such as a Fe—Ni alloy, stainless steel, solder, beryllium copper, bronze, phosphor bronze, or brass; and conductive particles obtained by subjecting surfaces of carbon particles or ceramic particles to a treatment such as metal coating.

The linear carbon pieces 5 may be members disposed between the heat-conductive resin 4 and the heat spreader 8 and are thermally in contact with the CNTs 10 included in the heat-conductive resin 4. The linear carbon pieces 5 may be, for example, CNTs or carbon fibers. When CNTs are used as the linear carbon pieces 5, the CNTs may have a diameter of, for example, about 10 nm to 30 μm and a length of, for example, about 10 μm to 3 mm. The CNTs may each be a single-walled CNT (single-walled carbon nanotube (SWNT)) or a multi-walled CNT (multi-walled carbon nanotube (MWNT)).

The heat spreader 8 cools the semiconductor device 3. The heat spreader 8 absorbs heat generated in the semiconductor device 3 through the heat-conductive resin 4 in a wide area and dissipates the heat to the surrounding atmosphere. The heat spreader 8 may be composed of a material having a thickness of, for example, about 5 to 15 mm and containing Cu or Al. The adhesive 9 used to fix the heat spreader 8 onto the circuit board 1 may be, for example, an organic sealant.

Figure 2A:
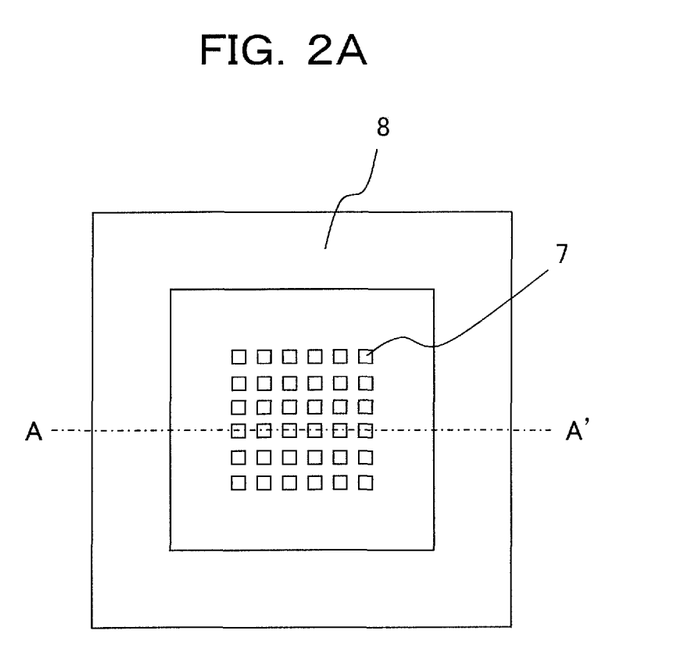
FIGS. 2A and 2B illustrate an exemplary heat spreader.
Figure 2B:
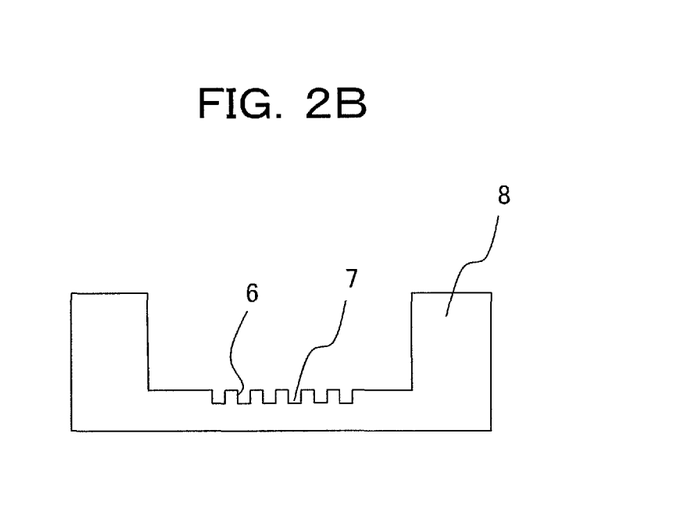

FIGS. 2A and 2B illustrate an exemplary heat spreader. FIG. 2A is a plan view of the heat spreader. FIG. 2B is a sectional view taken along alternate long and short dashed line IIB-IIB illustrated in FIG. 2A.

As illustrated in FIG. 2B, a plurality of depressed portions 7 are formed in the inner wall of the heat spreader 8. As illustrated in FIG. 1, the plurality of depressed portions 7 may be formed in a region where the heat spreader 8 and the heat-conductive resin 4 are bonded to each other. The width of an opening of each of the depressed portions 7 may be smaller than the length of the linear carbon pieces 5 so that, when the linear carbon pieces 5 are supplied, the linear carbon pieces 5 do not easily enter the depressed portions 7. For example, the depressed portions 7 may have a width of about 10 to 100 μm and a depth of about 50 μm. The distance between the depressed portions 7 adjacent to each other may be, for example, about 100 μm or more.

The shape of the depressed portions 7 illustrated in FIGS. 2A and 2B is a prism, but may be a cylinder, an elliptic cylinder, or a polygonal prism. A linearly formed groove may be used as the depressed portions 7. The depressed portions 7 may be formed by selecting a suitable method from wet etching, dry etching, molding, cutting, and pressing in accordance with the material of the heat spreader 8 or the shape and size of the depressed portions 7 to be formed.

FIGS. 3A and 3B, 4A and 4B, and 5A and 5B illustrate an exemplary method for producing an electronic device. In FIGS. 3A to 5B, the wiring patterns and via holes in the circuit board 1 may be omitted.

Figure 3A:
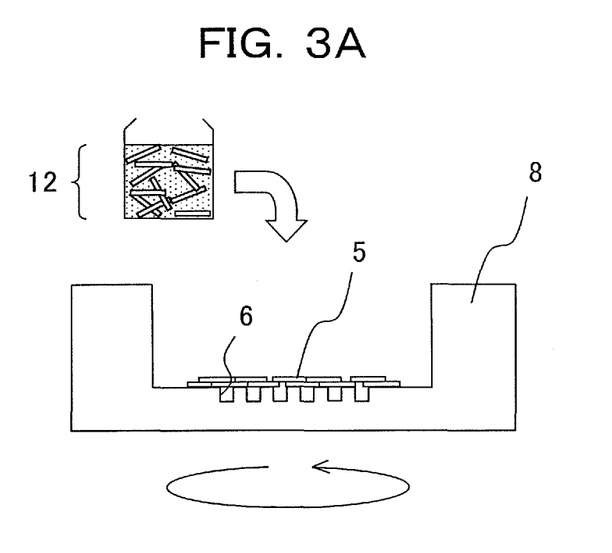
FIGS. 3A and 3B illustrate an exemplary method for producing an electronic device.

A heat spreader 8 including depressed portions 7 formed in its inner wall is prepared, and part of openings 6 of the depressed portions 7 in the heat spreader 8 is covered with linear carbon pieces 5.

To cover the openings 6, as illustrated in FIG. 3A, a dispersion liquid 12 obtained by dispersing CNTs serving as the linear carbon pieces 5 in a solvent is prepared. The solvent of the dispersion liquid 12 may be a solvent that has high dispersibility of CNTs and good drying properties after dispersion. Examples of the solvent include ethanol, isopropyl alcohol (IPA), toluene, methyl ethyl ketone (MEK), water ($H_2O$), and N-methyl-2-pyrrolidone (NMP).

The dispersion liquid 12 may have low concentration in accordance with the dispersibility of CNTs, and the concentration may be, for example, about 0.1 to 0.3 wt %. If the concentration of the dispersion liquid 12 is less than 0.1 wt %, spin coating may be repeatedly performed to achieve a desired coverage. The coverage is defined as the ratio of an area in which the openings 6 are covered with the linear carbon pieces 5 relative to an area of the openings 6 in the depressed portions 7. If the concentration of the dispersion liquid 12 is more than 0.3 wt %, aggregation between CNTs may be caused.

Figure 3B:
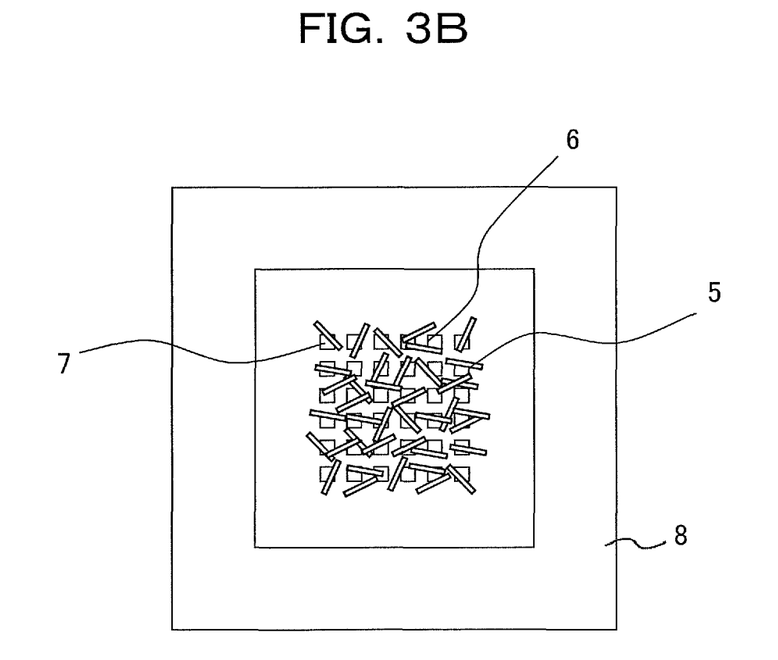

For example, with a dispenser, the dispersion liquid 12 is dropped onto a surface of the heat spreader 8 in which the depressed portions 7 are formed. The dropped dispersion liquid 12 is subjected to spin coating with a spin coater or the like. In the spin coating, as illustrated in FIGS. 3A and 3B, the linear carbon pieces 5 are physically adsorbed onto the surface of the inner wall of the heat spreader 8 and part of the openings 6 is covered with the linear carbon pieces 5. In a spin coating process, the amount of linear carbon pieces supplied is controlled by adjusting the concentration of a dispersion liquid and the number of revolutions of spin coating. Therefore, a desired coverage may be achieved. In the case where the length of the linear carbon pieces is larger than the width of the openings in the depressed portions, the linear carbon pieces do not easily enter the depressed portions. Thus, the linear carbon pieces may be disposed on the openings in the depressed portions.

Figure 4A:
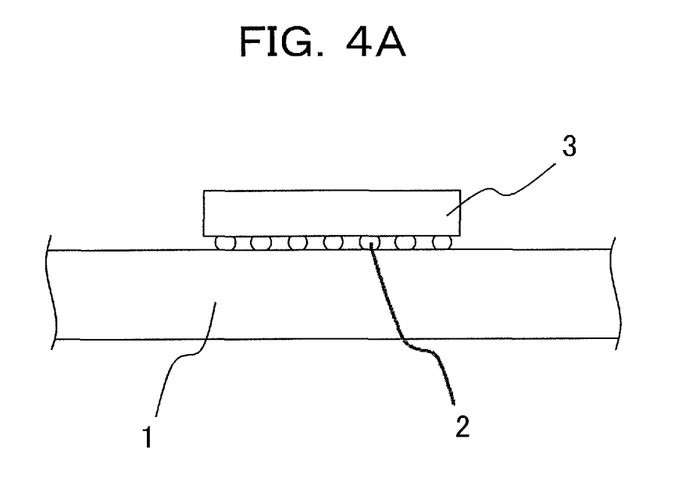
FIGS. 4A and 4B illustrate an exemplary method for producing an electronic device.

As illustrated in FIG. 4A, a semiconductor device 3 is mounted above a circuit board 1 with solder bumps 2 therebetween.

Figure 4B:
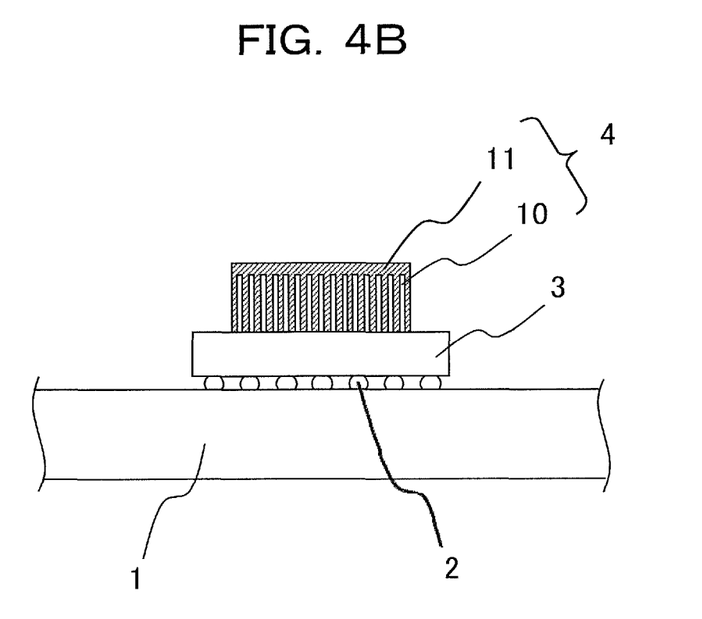

As illustrated in FIG. 4B, a heat-conductive resin 4 obtained by embedding CNTs 10 in a resin 11 is disposed on the semiconductor device 3 mounted above the circuit board 1. After the heat-conductive resin 4 is disposed on the semiconductor device 3, a heat treatment is performed on the heat-conductive resin 4 optionally under a load to bond the heat-conductive resin 4 to the semiconductor device 3.

Figure 5A:
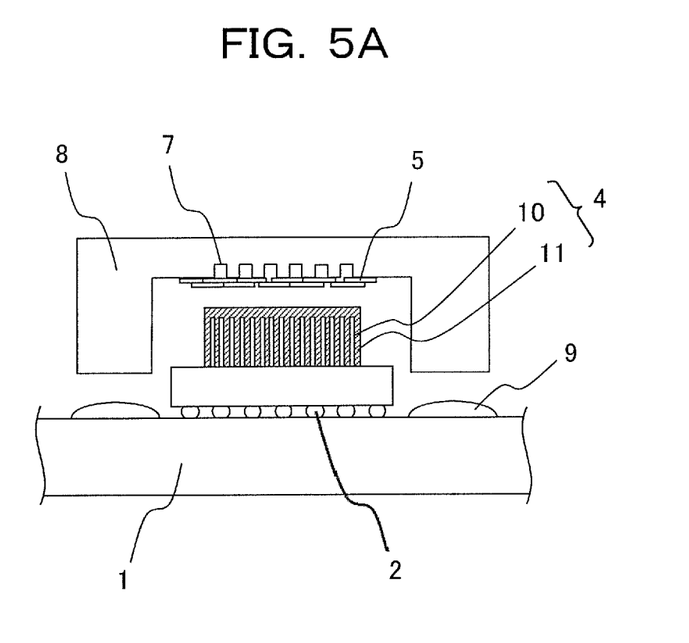
FIGS. 5A and 5B illustrate an exemplary method for producing an electronic device.

As illustrated in FIG. 5A, an adhesive 9 for fixing the heat spreader 8 is applied onto the circuit board 1, and then the heat spreader 8 onto which the linear carbon pieces 5 have been physically adsorbed is mounted on the heat-conductive resin 4. For example, the heat spreader 8 may be mounted on the heat-conductive resin 4 such that a surface covered with the linear carbon pieces 5 faces the heat-conductive resin 4. When the heat spreader 8 is mounted, a heat treatment may be performed while a load is imposed on the heat spreader 8 in the direction from the heat spreader 8 to the semiconductor device 3. The load imposed on the heat spreader 8 may be, for example, about 0.25 Pa. The heat treatment may be performed by reflowing or the like, for example, at 195° C. for about 10 minutes.

Figure 5B:
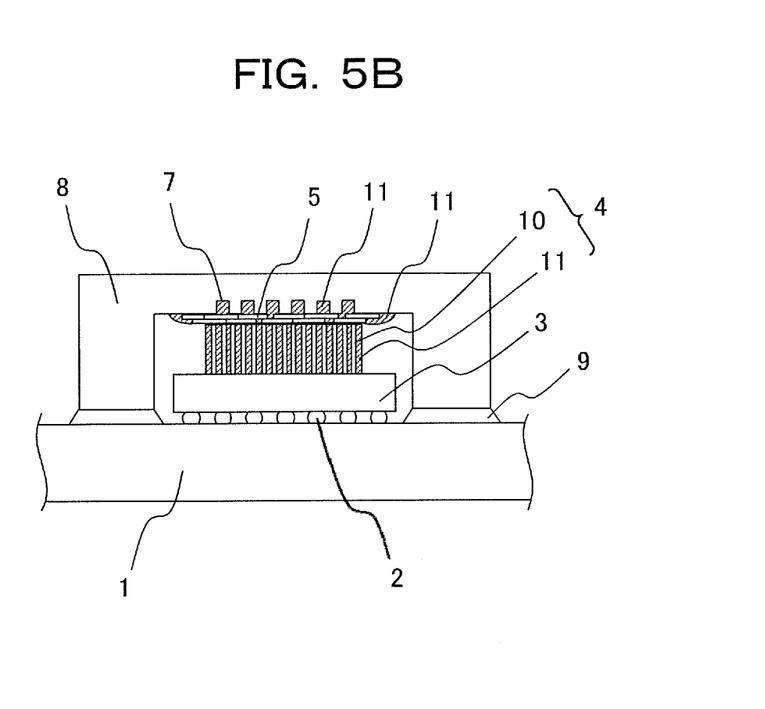

As illustrated in FIG. 5B, through the heat treatment, the heat-conductive resin 4 melts and then flows in a direction in which a surface of the inner wall of the heat spreader 8 extends. At the same time, part of the heat-conductive resin 4 flows into the depressed portions 7 through the gaps of the linear carbon pieces 5 adjacent to each other. Through this process, a resin 11 between the CNTs 10 and the linear carbon pieces 5 is removed, and the CNTs 10 and the linear carbon pieces 5 are brought into contact with each other. Thus, a heat conduction path in which heat is conducted from the semiconductor device 3 serving as a heat source to the heat spreader 8 through the CNTs 10 and linear carbon pieces 5 is formed. The heat-conductive resin 4 that flows into the depressed portions 7 may be the resin 11 or a material containing the CNTs 10 or the linear carbon pieces 5. In the case where a plurality of the depressed portions 7 are formed, all the depressed portions 7 may not be necessarily filled with the heat-conductive resin 4. Each of the depressed portions 7 may not be necessarily completely filled with the heat-conductive resin 4.

When the heat-conductive resin 4 is flowing into the depressed portions 7, the pressure exerted due to the flow of the heat-conductive resin 4 may be applied not only in the direction in which a surface of the inner wall of the heat spreader 8 extends but also in the depth direction of the depressed portions 7. Since the depressed portions 7 are formed in the inner wall of the heat spreader 8, the pressure exerted due to the flow is also applied in the depth direction of the heat spreader 8. Therefore, many of the linear carbon pieces 5 may remain in a state in which they cover part of the openings 6. The outflow of linear carbon pieces present above the semiconductor device to the periphery due to the flow of the heat-conductive resin is reduced. As a result, a decrease in the density of the linear carbon pieces present above the semiconductor device compared with the density of the linear carbon pieces present in the periphery is reduced.

Since part of the openings in the depressed portions formed in the heat spreader is covered with the linear carbon pieces, the linear carbon pieces function as a filter that preferentially passes a resin component of the heat-conductive resin. A resin that may remain between the heat spreader and the heat conductor is selectively guided to the depressed portions by the filter. Therefore, even if the heat spreader has an uneven surface or the heat spreader itself has undulations, the amount of a resin remaining between the heat spreader and the heat conductor is reduced, thereby improving the heat dissipation characteristics of the semiconductor device.

Since the linear carbon pieces 5 and the heat conductors of the heat-conductive resin 4 are in contact with each other, a preferred coverage of the linear carbon pieces 5 that cover the openings 6 may be dependent on the types of the heat conductors. When CNTs are used as the heat conductors, the coverage of the linear carbon pieces 5 is dependent on the orientation state of CNTs in the heat-conductive resin 4 and may be, for example, about 1% to 80%. In view of the permeability of the resin 11 through gaps between the linear carbon pieces 5, the coverage of the linear carbon pieces 5 may be, for example, about 10% to 50%. If the coverage is less than 10%, the linear carbon pieces 5 having a length smaller than the width of the depressed portions 7 easily enter the depressed portions 7 with high probability. Therefore, the amount of the heat-conductive resin 4 remaining between the heat spreader 8 and the CNTs 10 is sometimes not reduced. If the coverage is more than 80%, the area of the gaps between the linear carbon pieces 5 is reduced and therefore the amount of the resin 11, which is a resin component of the heat-conductive resin 4, introduced into the depressed portions 7 is reduced. As a result, the amount of the heat-conductive resin 4 remaining between the heat spreader 8 and the CNTs 10 is sometimes not reduced.

Figure 6:
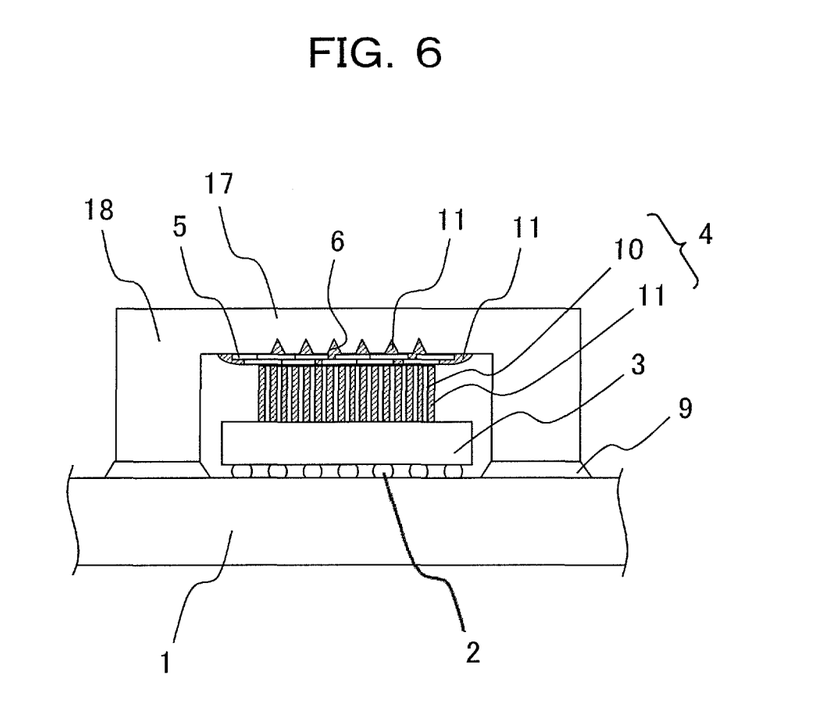
FIG. 6 illustrates an exemplary electronic device.
Figure 7A:
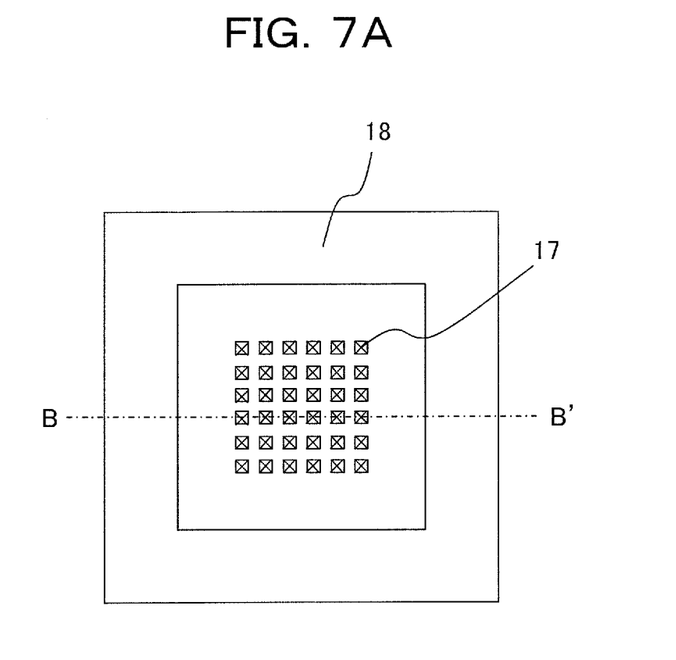
FIGS. 7A and 7B illustrate an exemplary heat spreader.
Figure 7B:
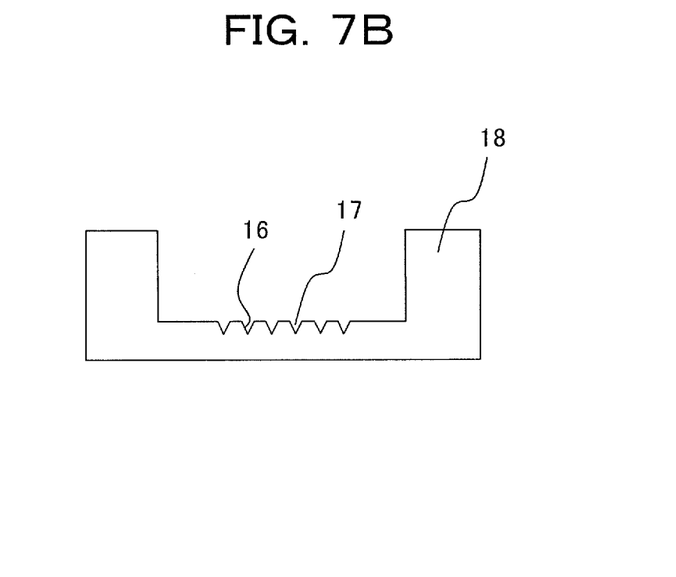

FIG. 6 illustrates an exemplary electronic device. FIGS. 7A and 7B illustrate an exemplary heat spreader. A heat spreader 18 illustrated in FIGS. 7A and 7B may be included in the electronic device illustrated in FIG. 6. FIG. 7A is a plan view of the heat spreader 18. FIG. 7B is a sectional view taken along alternate long and short dashed line VIIB-VIIB illustrated in FIG. 7A.

As illustrated in FIGS. 7A and 7B, each of depressed portions 17 formed in the inner wall of the heat spreader 18 has a shape in which the size of an opening 16 is decreased as the depth is increased. As illustrated in FIG. 1, air is present in the depressed portions 7. Therefore, when the heat spreader 8 is mounted, the resin 11 enters the depressed portions 7 through the gaps between the linear carbon pieces 5 while at the same time the air inside the depressed portions 7 is discharged to the outside through the gaps between the linear carbon pieces 5. The air is discharged because the pressure exerted when the resin 11 enters is applied to the air inside the depressed portions 7. The depressed portions 17 formed in the inner wall of the heat spreader 18 illustrated in FIG. 7B have a shape in which the size of the opening 16 is decreased as the depth is increased. The shape of the depressed portions 17 formed in the inner wall of the heat spreader 18 guides the air in a direction different from the direction in which the resin enters. Therefore, the air inside the depressed portions 17 may be easily removed. The depressed portions 17 illustrated in FIGS. 7A and 7B have a cone-like shape, but may have a pyramid-like shape or a spindle-like shape.

Figure 8:
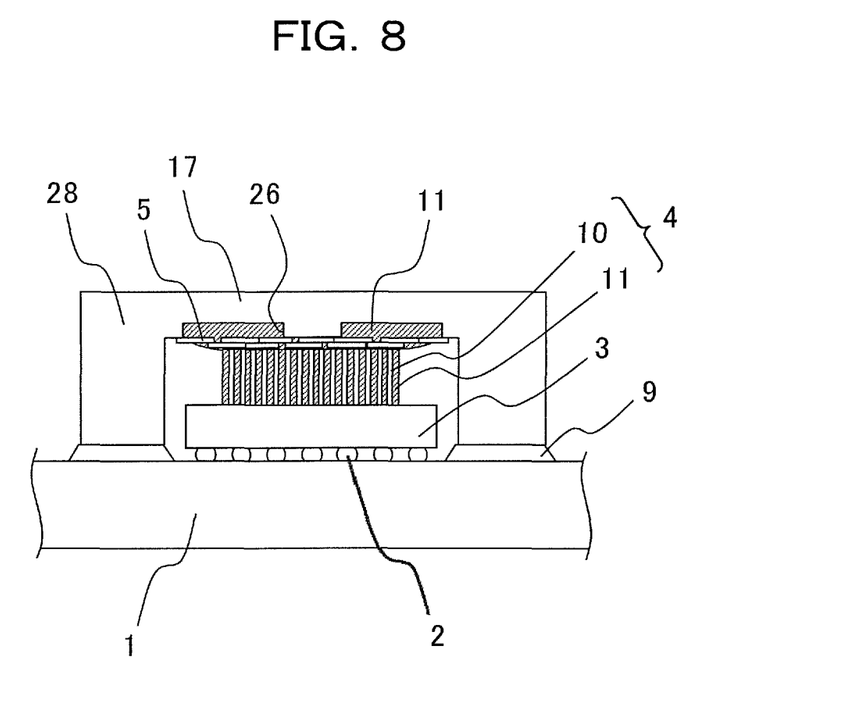
FIG. 8 illustrates an exemplary electronic device.
Figure 9A:
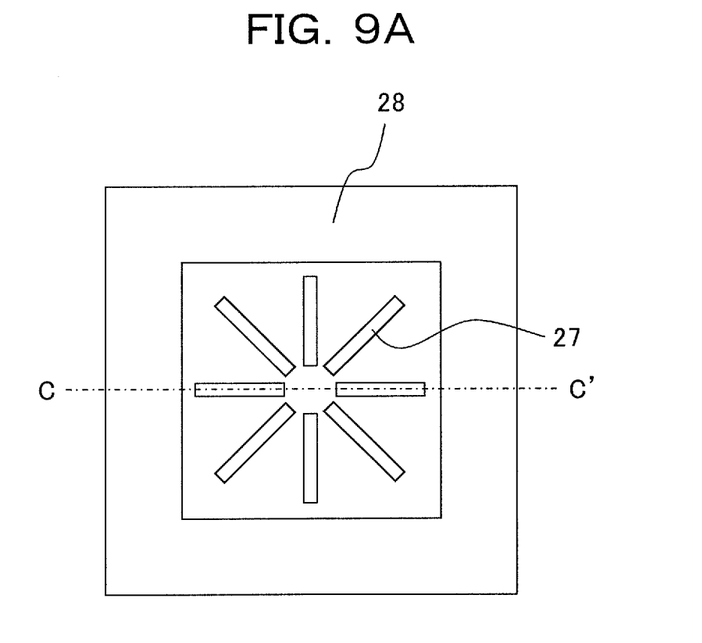
FIGS. 9A and 9B illustrate an exemplary heat spreader.
Figure 9B:
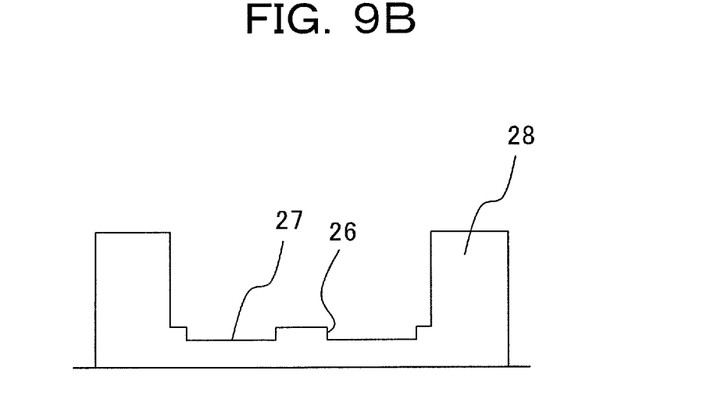

FIG. 8 illustrates an exemplary electronic device. FIGS. 9A and 9B illustrate an exemplary heat spreader. A heat spreader 28 illustrated in FIGS. 9A and 9B may be included in the electronic device illustrated in FIG. 8. FIG. 9A is a plan view of the heat spreader 28. FIG. 9B is a sectional view taken along alternate long and short dashed line IXB-IXB illustrated in FIG. 9A. As illustrated in FIGS. 8, 9A, and 9B, the depressed portions formed in the inner wall of the heat spreader 28 are linear grooves (line grooves) 27.

Since the depressed portions of the heat spreader are linear grooves 27, the area of an opening 26 of the depressed portion and the volume of the depressed portion are increased and thus a large amount of resin may be guided into the linear grooves 27 compared with individually formed depressed portions. Therefore, the length of the grooves and the distance between the grooves may be easily adjusted in accordance with the amount of a resin that may remain between the heat conductor and the heat spreader.

The method for arranging linear grooves may include a method in which linear grooves are arranged in parallel with a certain distance therebetween and a method in which linear grooves are arranged so that openings 26 extend in a radial manner from the center of the heat spreader as illustrated in FIG. 9A. The linear grooves arranged in a radial manner also have a function as vent grooves that guide the air from the center of the heat spreader to the periphery. Therefore, the air in the grooves may be easily discharged in the direction from the center of the heat spreader to the outer side.

Figure 10:
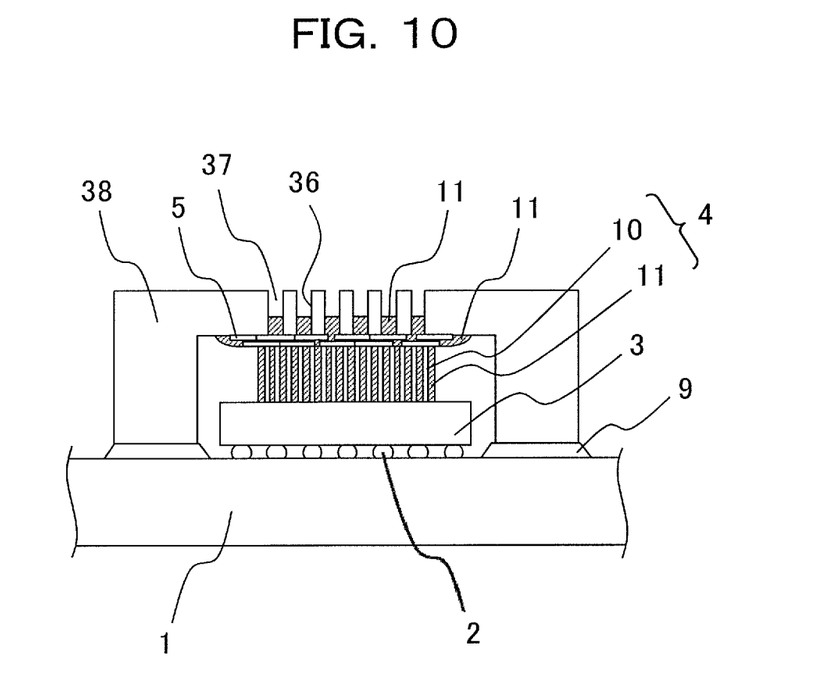
FIG. 10 illustrates an exemplary electronic device.
Figure 11A:
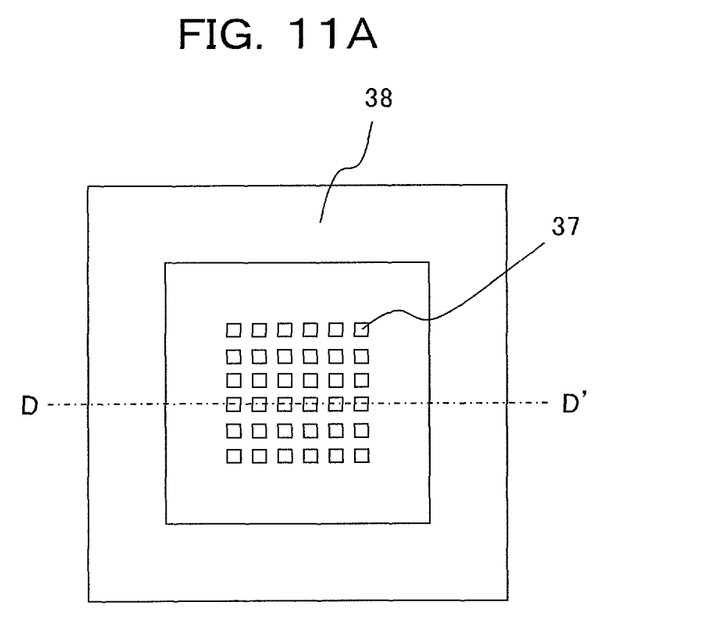
FIGS. 11A and 11B illustrate an exemplary a heat spreader.
Figure 11B:
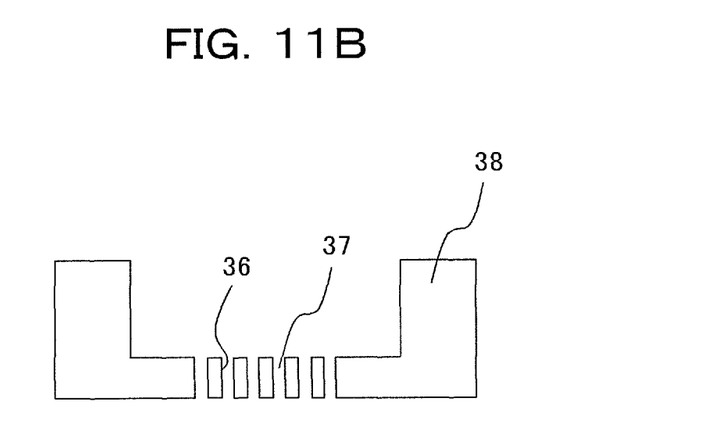

FIG. 10 illustrates an exemplary electronic device. FIGS. 11A and 11B illustrate an exemplary heat spreader. A heat spreader 38 illustrated in FIGS. 11A and 11B may be included in the electronic device illustrated in FIG. 10. FIG. 11A is a plan view of the heat spreader 38. FIG. 11B is a sectional view taken along alternate long and short dashed line XIB-XIB illustrated in FIG. 11A.

As illustrated in FIGS. 11A and 11B, the depressed portions formed in the inner wall of the heat spreader 38 include through holes 37. Since the depressed portions formed in the inner wall of the heat spreader 38 include through holes 37, the heat-conductive resin enters the through holes 37 from an opening 36 while at the same time the air in the through holes 37 is discharged from an opening of the heat spreader 38 on the opposite side. Therefore, the flowability of the heat-conductive resin is improved and the depressed portions are filled with the heat-conductive resin at a lower pressure. As a result, the depressed portions are easily filled with the heat-conductive resin.

All the depressed portions of the heat spreader 38 illustrated in FIGS. 10, 11A, and 11B include through holes. For example, through holes may be formed near the central portion of the heat spreader in which a resin easily remains between a heat conductor and the heat spreader and the discharge of the air inside the depressed portions is relatively difficult. Through holes may be formed on a certain cycle of the depressed portions. As described above, some of the depressed portions may be through holes. When some of the depressed portions include through holes, the time for forming holes in the heat spreader in the thickness direction may be shortened. When through holes are formed on a certain cycle of the depressed portions, the heat spreader may be produced in consideration of the manufacturing precision of through holes, for example, the manufacturing limit regarding the distance between through holes.

For example, the distances between the depressed portions formed in the heat spreader are not necessarily equal. The width and depth of the depressed portions may be suitably set in accordance with the position in the heat spreader.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
    a semiconductor device;
    a heat-conductive resin, disposed above the semiconductor device and being in contact with a first surface of the semiconductor device, including heat conductors which are arranged in a direction orthogonal to the first surface and a resin with which gaps between the heat conductors is filled;
    a linear carbon piece disposed above the heat-conductive resin; and
    a heat spreader, disposed above the linear carbon piece, including a depressed portion having the resin,
    the linear carbon piece configured to be thermally in contact with the heat conductor at a second surface of the heat spreader facing the first surface of the semiconductor device,
    wherein the linear carbon piece is disposed so that a longitudinal side of the linear carbon piece is along with the second surface of the heat spreader.

2. The electronic device according to claim 1, wherein the linear carbon piece covers part of an opening of the depressed portion.

3. The electronic device according to claim 1, wherein the linear carbon piece is disposed between the heat-conductive resin and the heat spreader in a dispersed manner.

4. The electronic device according to claim 3, wherein the resin covers the second surface of the heat spreader in a region larger than a region where the linear carbon piece is dispersed.

5. The electronic device according to claim 1, wherein a width of an opening of the depressed portion is smaller than a length of the linear carbon piece.

6. The electronic device according to claim 1, wherein the depressed portion includes a hole that has a shape in which a size of an opening is decreased as a depth of the depressed portion is increased.

7. The electronic device according to claim 1, wherein the depressed portion is a linear groove.

8. The electronic device according to claim 1, wherein the depressed portion is a through hole.

9. The electronic device according to claim 1, wherein a coverage of the linear carbon piece relative to an area of an opening of the depressed portion is 10% to 50%.

10. An electronic device comprising:
    a semiconductor device; a heat-conductive resin, disposed above the semiconductor device, including a heat conductor and a resin;
    a linear carbon piece, disposed above the heat-conductive resin, to be thermally in contact with the heat conductor; and
    a heat spreader, disposed above the linear carbon piece, including a depressed portion having the heat-conductive resin,
    wherein a coverage of the linear carbon piece relative to an area of an opening of the depressed portion is 10% to 50%.

11. A method of manufacturing an electronic device, comprising:
    disposing, on a first surface of a semiconductor device, a heat-conductive resin including heat conductors which are arranged in a direction orthogonal to the first surface of the semiconductor device and a resin with which gaps between the heat conductors is filled so that the heat-conductive resin is in contact with the first surface of the semiconductor device;

covering, with a linear carbon piece, part of an opening of a depressed portion formed in a heat spreader at a second surface of the heat spreader facing the first surface of the semiconductor device; and filling the depressed portion with the resin by pressing the heat spreader covered with the linear carbon piece against the heat-conductive resin, wherein the linear carbon piece is disposed so that a longitudinal side of the linear carbon piece is along with the second surface of the heat spreader.

12. The method according to claim 11, wherein at least part of the depressed portion is a through hole.

13. The method according to claim 12 further comprising: filling the through hole with the resin from one opening of the through hole; and discharging air from the other opening of the through hole.

14. The method according to claim 11, wherein a coverage of the linear carbon piece relative to an area of an opening of the depressed portion is 10% to 50%.

\* \* \* \* \*